United States Patent
Wen et al.

(10) Patent No.: US 8,952,757 B2
(45) Date of Patent: Feb. 10, 2015

(54) AMPLIFIERS WITH ENHANCED POWER SUPPLY REJECTION RATIO AT THE OUTPUT STAGE

(71) Applicant: MediaTek Inc., Hsin-Chu (TW)

(72) Inventors: Sung-Han Wen, Taipei (TW); Chien-Chung Yang, Kaohsiung (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 13/922,884

(22) Filed: Jun. 20, 2013

(65) Prior Publication Data

US 2014/0015610 A1    Jan. 16, 2014

Related U.S. Application Data

(60) Provisional application No. 61/670,248, filed on Jul. 11, 2012.

(51) Int. Cl.
| | |
|---|---|
| *H03G 3/10* | (2006.01) |
| *H03G 3/00* | (2006.01) |
| *H03F 1/30* | (2006.01) |
| *H03F 3/30* | (2006.01) |

(52) U.S. Cl.
CPC ............ *H03G 3/004* (2013.01); *H03G 3/007* (2013.01); *H03F 1/301* (2013.01); *H03F 3/3022* (2013.01)
USPC .......................................... 330/278; 330/264

(58) Field of Classification Search
USPC .......................................... 330/278, 264, 254
See application file for complete search history.

(56) References Cited

U.S. PATENT DOCUMENTS

| | | | | |
|---|---|---|---|---|
| 7,301,320 | B2 * | 11/2007 | Dreps et al. ................... | 323/299 |
| 2008/0012574 | A1 * | 1/2008 | Malherbe et al. ............. | 324/606 |
| 2010/0259310 | A1 * | 10/2010 | Bae et al. ...................... | 327/288 |
| 2011/0286751 | A1 * | 11/2011 | Yutani ........................... | 398/136 |

OTHER PUBLICATIONS

Op't Eynde, F.N.L., et al.; A CMOS Large-Swing Low-Distortion Three-Stage Class AB Power Amplifier; IEEE Journal of Solid-State Circuits; vol. 25; No. 1; Feb. 1990; pp. 265-273.

Wen, S.H., et al.; "A 5.2mW, 0.0016% THD up to 20kHz, Ground-Referenced Audio Decoder with PSRR-enhanced Class-AB 16Ohm Headphone Amplifiers;" pp. 1-2.

* cited by examiner

*Primary Examiner* — Henry Choe

(74) *Attorney, Agent, or Firm* — McClure, Qualey & Rodack, LLP

(57) ABSTRACT

An amplifier circuit is disclosed. The amplifier circuit includes a detection circuit, a control amplifier circuit and an output stage. The detection circuit detects disturbances occurring in a first supply voltage and provides detection results. The control amplifier circuit controls a first voltage provided to a first control node and a second voltage provided to a second control node in response to the detection results. The output stage circuit includes a first output power transistor coupled to the control amplifier circuit at the first control node and a second output power transistor coupled to the control amplifier circuit at the second control node. The first voltage and the second voltage are controlled differently when a disturbance is detected to have occurred.

18 Claims, 8 Drawing Sheets

US 8,952,757 B2

AMPLIFIERS WITH ENHANCED POWER SUPPLY REJECTION RATIO AT THE OUTPUT STAGE

CROSS REFERENCE TO RELATED APPLICATIONS

This application claims the benefit of U.S. Provisional Application No. 61/670,248 filed 2012 Jul. 11 titled "A 5.2 MW, 0.0016% THD up to 20 KHz, Ground-Referenced Audio Decoder With PSRR-Enhanced Class AB 16 Ohm Headphone Amplifiers", the entirety of which is incorporated by reference herein.

BACKGROUND OF THE INVENTION

1. Field of the Invention

The invention relates to amplifier circuit designs, and more particularly to a PSRR-enhanced output stage for amplifier circuit designs.

2. Description of the Related Art

Amplifiers are used for many applications including audio signal processing, video processing, communications, control systems, satellites, and so on. In low-power amplifier designs, the amplifier's Total Harmonic Distortion (THD) always degrades at high frequencies due to insufficient loop gain. Especially, when the output stage of the low-power amplifier suffers from noisy supply voltage, the noises generated from the supply voltage will finally present in the output signal, which results in undesired signal distortion.

Therefore, several novel amplifier designs with an enhanced Power Supply Rejection Ratio (PSRR) at the output stage are required.

BRIEF SUMMARY OF THE INVENTION

Amplifier circuits are provided. An exemplary embodiment of an amplifier circuit receiving a first supply voltage and a second supply voltage comprises a detection circuit, a control amplifier circuit and an output stage circuit. The detection circuit detects disturbances occurring in the first and/or second supply voltage and then provides the detection results to the control amplifier circuit. The control amplifier circuit, coupled to the detection circuit, controls a first voltage provided to a first control node and a second voltage provided to a second control node in response to the detected results. The output stage circuit comprises a first output power transistor coupled to the control amplifier circuit at the first control node and a second output power transistor coupled to the control amplifier circuit at the second control node. The first voltage and the second voltage are controlled differently when a disturbance is detected to have occurred.

Another exemplary embodiment of an amplifier circuit comprises a detection circuit, a control amplifier circuit and an output stage circuit. The output stage circuit provides an output signal of the amplifier according to a first voltage and a second voltage. The control amplifier circuit provides the first voltage and the second voltage to the output stage circuit. The detection circuit detects disturbances occurring in a first supply voltage and providing detection results to the control amplifier circuit. The control amplifier circuit only adjusts the first voltage in response to the detected disturbance occurring in the first supply voltage.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
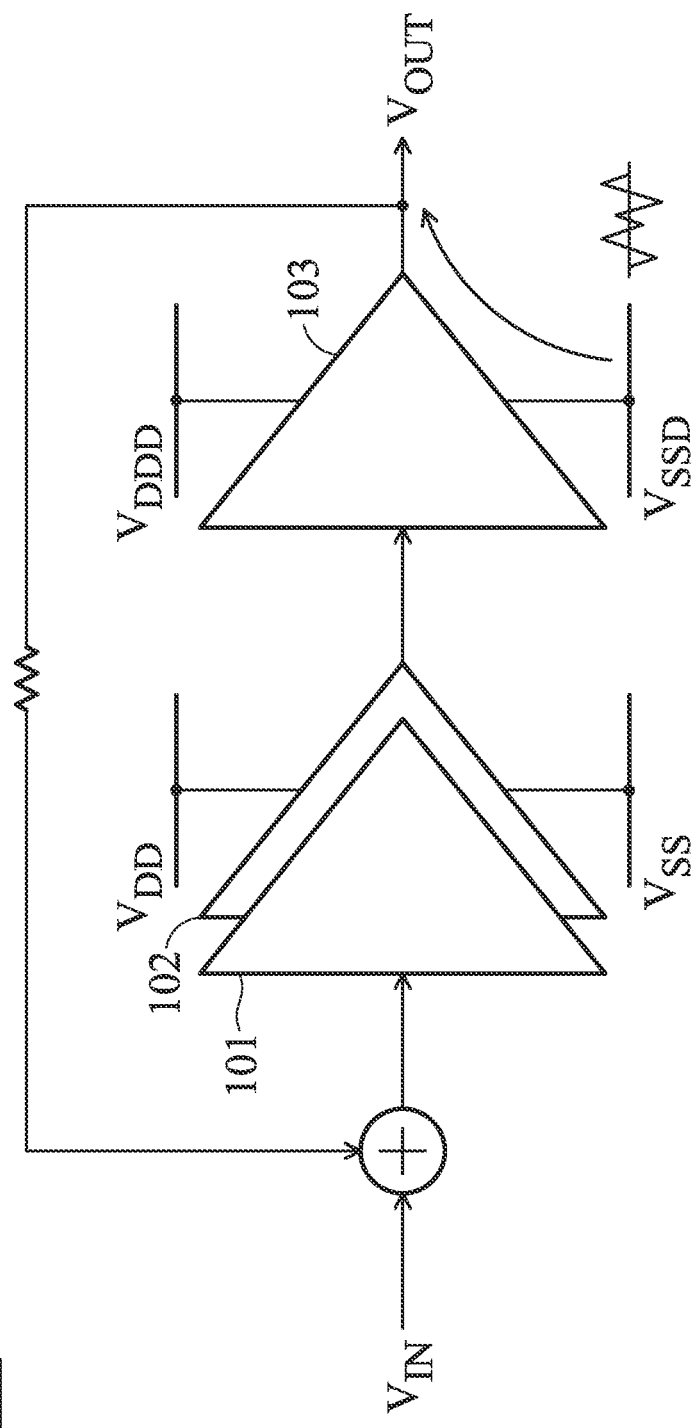
FIG. 1 shows a schematic diagram of a low-power amplifier design according to an embodiment of the invention.

FIG. 1 shows a schematic diagram of a low-power amplifier design according to an embodiment of the invention. The low-power amplifier 100 is a negative-feedback low-power amplifier, and may comprise a plurality of stages of amplifier circuits, such as 101, 102 and 103 and a feedback resistor. The amplifier circuit 101 may be arranged to receive the input signal $V_{IN}$ and the amplifier circuit 103 may be arranged to generate the output signal $V_{OUT}$. Generally, for the purpose of keeping low power consumption, the operation bandwidth of the low-power amplifier will be limited, and thus the gain bandwidth will be limited. However, when the operation bandwidth of the low-power amplifier is not wide enough, the low-power amplifier is unable to trace and then suppress the high-frequency disturbances that occur in the supply voltage (for example, the disturbance occurred in the noisy supply voltages $V_{DDD}$ and/or $V_{SSD}$, where the supply voltages $V_{DD}$ and $V_{SS}$ represents the clean supply voltages), resulting in undesired signal distortion presented in the output signal $V_{OUT}$. The noisy supply voltages $V_{DDD}$ and $V_{SSD}$ may be outputted by, for example but not limited to, the switching regulator, while the clean supply voltages $V_{DD}$ and $V_{SS}$ may be outputted by, for example but not limited to, the linear regulator. To solve this problem, several novel amplifier designs with enhanced Power Supply Rejection Ratio (PSRR) at the output stage amplifier circuit (such as the amplifier circuit 103 in FIG. 1) are proposed.

Figure 2:
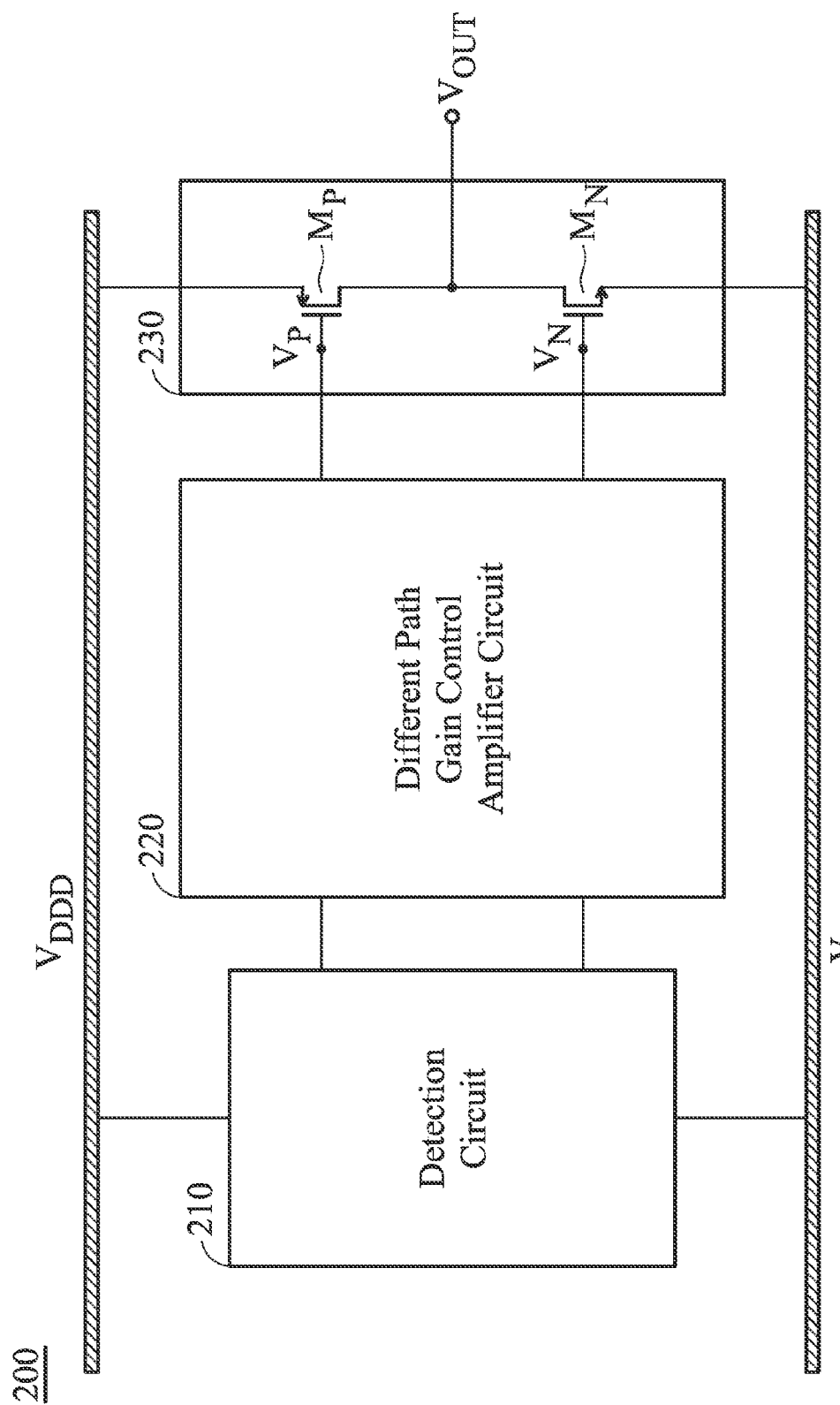
FIG. 2 shows a block diagram of an exemplary amplifier circuit according to an embodiment of the invention.

FIG. 2 shows a block diagram of an exemplary amplifier circuit according to an embodiment of the invention. The amplifier circuit 200 may at least comprise a detection circuit 210, a control amplifier circuit (e.g. a different path gain control amplifier circuit 220 shown in FIG. 2) and an output stage circuit 230. The detection circuit 210 is coupled to the supply voltages $V_{DDD}$ and/or $V_{SSD}$ (which may be the noisy supply voltages) and is arranged to detect disturbances that occur in the supply voltages $V_{DDD}$ and/or $V_{SSD}$ to provide detection results to the different path gain control amplifier circuit 220. The disturbances may be occurred when, for example, large current is drawn out from or pulled into the supply voltage by a load (not shown) coupled to the amplifier circuit 200, causing undesired voltage drops or raises on the supply voltages $V_{DDD}$ and/or $V_{SSD}$. According to the embodiments of the invention, the detection results may for example be represented by, but not limited to, the corresponding signals, voltages or currents that can carry, reveal or indicate the amount of change in the supply voltages $V_{DDD}$ and/or $V_{SSD}$.

The different path gain control amplifier circuit 220 is arranged to control quiescent current of the output stages, such that the quiescent current can be fixed and stable. According to the embodiments of the invention, besides providing quiescent current control, the different path gain control amplifier circuit 220 is further arranged to generate the control voltage to the control nodes $V_P$ and $V_N$ when a disturbance has occurred in the supply voltages $V_{DDD}$ and/or $V_{SSD}$, so as to enhance the output stage PSRR. According to an embodiment of the invention, upon receiving the detection results indicating that some disturbance has occurred in the supply voltages $V_{DDD}$ and/or $V_{SSD}$, the different path gain control amplifier circuit 220 may further control a voltage provided to the control node $V_P$ and a voltage provided to the control node $V_N$ in response to the detected results. For example, the different path gain control amplifier circuit 220 may control the voltages by adjusting a first gain $G_P$ and a second gain $G_N$ of the different path gain control amplifier circuit 220 in response to the detection results. According to an embodiment of the invention, the first gain $G_P$ relates to the voltage provided to the control node $V_P$ and the second gain $G_N$ relates to the voltage provided to the control node $V_N$. For example, the first gain $G_P$ may be defined by a ratio of an amount of change in the voltage provided to the control node $V_P$ to an amount of change in the supply voltage (either the supply voltage $V_{DDD}$ or $V_{SSD}$), and the second gain $G_N$ may be defined by a ratio of an amount of change in the voltage provided to the control node $V_N$ to an amount of change in the supply voltage (either the supply voltage $V_{DDD}$ or $V_{SSD}$).

The output stage circuit 230 may comprise output power transistors $M_P$ and $M_N$. The output power transistor $M_P$ is coupled to the different path gain control amplifier circuit 220 at the control node $V_P$ and further coupled to the supply voltage $V_{DDD}$, and the output power transistor $M_N$ is coupled to the different path gain control amplifier circuit 220 at the control node $V_N$ and further coupled to the supply voltage $V_{SSD}$. Note that for brevity, the signal received from a previous stage amplifier circuit is not shown in FIG. 2 (but can be found in the detailed circuit diagram shown in FIG. 3 and FIG. 5).

According to an embodiment of the invention, the different path gain control amplifier circuit 220 may adjust the first gain $G_P$ and the second gain $G_N$ differently when a disturbance is detected to have occurred. By adjusting the first gain $G_P$ and the second gain $G_N$, a voltage provided to the control node $V_P$ and a voltage provided to the control node $V_N$ can be respectively adjusted via the different path gain control amplifier circuit 220, so as to prevent the output signal $V_{OUT}$ (or, the corresponding output current) being affected by the disturbance occurring in the supply voltages. In other words, based on the concept of the invention, by controlling the first gain $G_P$ and the second gain $G_N$ differently, the output signal $V_{OUT}$ or current will not be affected by the disturbance occurring in the supply voltages and thus, the undesired distortion will not occur. Please note that, in the embodiments, the control amplifier circuit (e.g. a different path gain control amplifier circuit 220 shown in FIG. 2) may adjust parameters other than the first gain $G_P$ and the second gain $G_N$ to achieve the results that the voltage provided to the control node $V_P$ and the voltage provided to the control node $V_N$ can be differently adjusted in response to the detected disturbances occurring in the supply source $V_{DDD}$ or $V_{SSD}$.

According to an embodiment of the invention, the different path gain control amplifier circuit 220 may control the first gain $G_P$ to be independent from the voltage change occurring in the supply voltage $V_{SSD}$, and control the second gain $G_N$ to be independent from the voltage change occurring in the supply voltage $V_{DDD}$. In this manner, the voltage provided to the control node $V_P$ does not change when a disturbance is detected to have occurred in the supply voltage $V_{SSD}$ and the voltage provided to the control node $V_N$ does not change when a disturbance is detected to have occurred in the supply voltage $V_{DDD}$. According to another embodiment of the invention, the different path gain control amplifier circuit 220 may control an amount of change in the voltage provided to the control node $V_P$ correlates with an amount of change in the supply voltage $V_{DDD}$ and an amount of change in the voltage provided to the control node $V_N$ is less than the amount of change in the voltage provided to the control node $V_P$ when a disturbance is detected to have occurred in the supply voltage $V_{DDD}$. The different path gain control amplifier circuit 220 may further control an amount of change in the voltage provided to the control node $V_N$ correlates with an amount of change in the supply voltage $V_{SSD}$ and an amount of change in the voltage provided to the control node $V_P$ is less than the amount of change in the voltage provided to the control node $V_N$ when a disturbance is detected to have occurred in the supply voltage $V_{SSD}$. According to yet another embodiment of the invention, the different path gain control amplifier circuit 220 may only adjust the voltage provided to the control node $V_P$ in response to the detected disturbance occurring in the supply voltage $V_{DDD}$ and only adjust the voltage provided to the control node $V_N$ in response to the detected disturbance occurring in the supply voltage $V_{SSD}$.

To be more specific, according to an embodiment of the invention, the different path gain control amplifier circuit 220 may control the first gain $G_P$ and the second gain $G_N$ as below:

For $V_{SSD}$ noisy case:

$$G_P(\text{from } V_{SSD} \text{ to } V_P)=0 \quad \text{Eq. (1)}$$

$$G_N(\text{from } V_{SSD} \text{ to } V_N)=1 \quad \text{Eq. (2)}$$

For $V_{DDD}$ noisy case:

$$G_P(\text{from } V_{DDD} \text{ to } V_P)=1 \quad \text{Eq. (3)}$$

$$G_N(\text{from } V_{DDD} \text{ to } V_N)=0 \quad \text{Eq. (4)}$$

The first gain $G_P$ represents a gain of the amount of voltage change in the supply voltage relative to the amount of voltage change in the voltage provided to the control node $V_P$, and the second gain $G_N$ represents a gain of the amount of voltage change in the supply voltage relative to the amount of voltage change in the voltage provided to the control node $V_N$. Therefore, for $V_{DDD}$ noisy case, since $G_P=1$, an amount of change in the voltage provided to the control node $V_P$ positively correlates with an amount of change in the supply voltage $V_{DDD}$. Similarly, for $V_{SSD}$ noisy case, since $G_N=1$, an amount of change in the voltage provided to the control node $V_N$ positively correlates with an amount of change in the supply voltage $V_{SSD}$.

Note that in conventional amplifier designs, the amount of change in the voltage provided to the control node $V_P$ is always the same as the amount of change in the voltage provided to the control node $V_N$ when a disturbance is detected to have occurred in the supply voltage. For example, in conventional amplifier designs, when the supply voltage $V_{SSD}$ is detected to have decreased by $\Delta$, the voltage provided to the gate of the output power transistor $M_N$ is decreased by $\Delta$, while the voltage provided to the gate of the output power transistor $M_P$ is also increased by $\Delta$. Similarly, when the supply voltage $V_{DDD}$ is detected to have increased by $\Delta$, the voltage provided to the gate of the output power transistor $M_P$ is increased by $\Delta$, while the voltage provided to the gate of the output power transistor $M_N$ is also decreased by $\Delta$.

However, unlike conventional amplifier designs, in the embodiments of the invention, the amount of change in the voltage provided to the control node $V_P$ is different from the amount of change in the voltage provided to the control node $V_N$ as described above. To be more specific, as described in Eq. (1)~Eq. (4), when a disturbance is detected to have occurred in the supply voltage $V_{DDD}$, the amount of change in the voltage provided to the control node $V_P$ correlates with the amount of change in the supply voltage $V_{DDD}$ and the voltage provided to the control node $V_N$ remains unchanged. Similarly, when a disturbance is detected to have occurred in the supply voltage $V_{SSD}$, the amount of change in the voltage provided to the control node $V_N$ correlates with the amount of change in the supply voltage $V_{SSD}$ and the voltage provided to the control node $V_P$ remains unchanged. Several embodiments for implementing the above-mentioned controlling mechanisms are further introduced in the following paragraphs.

Figure 3:
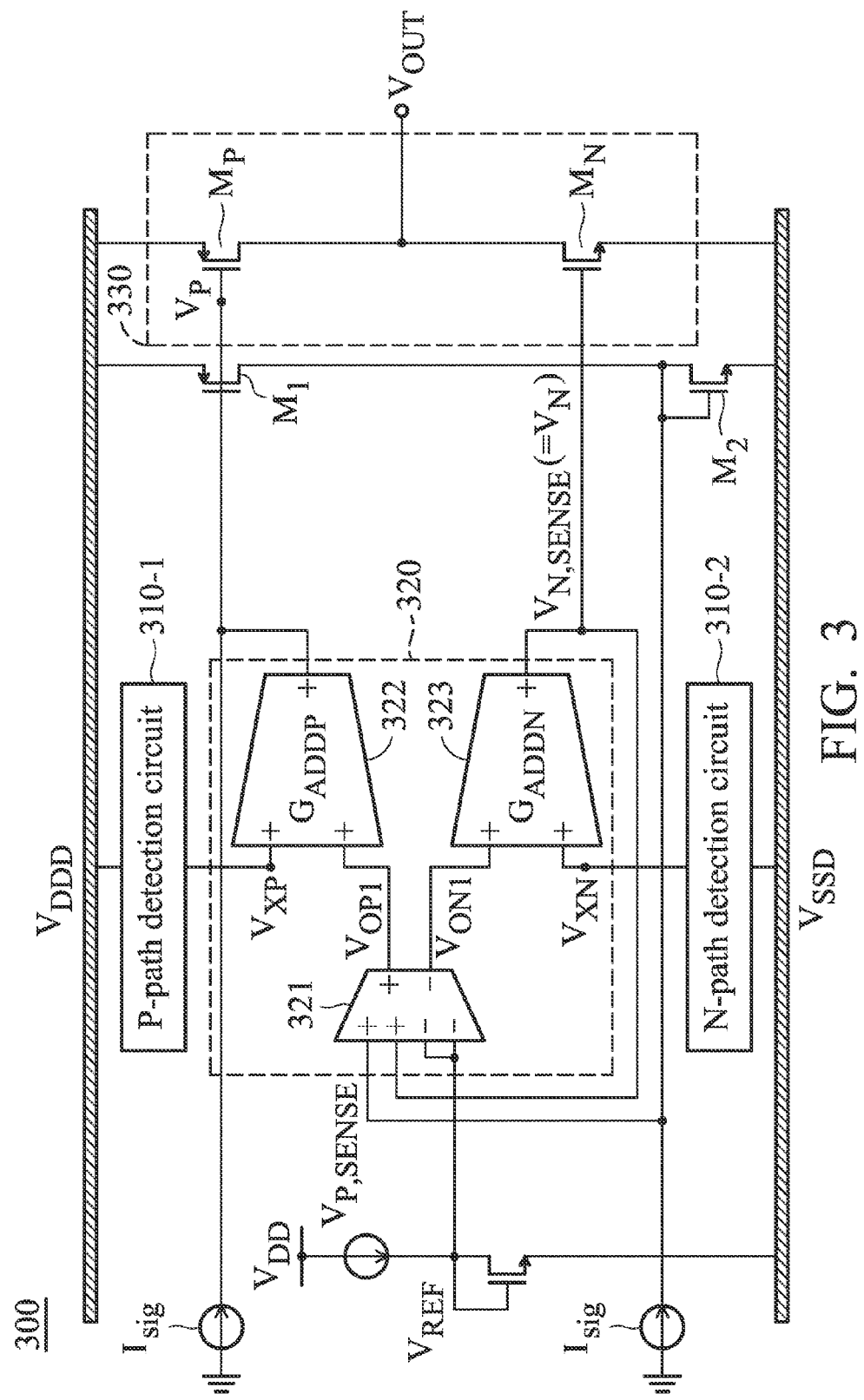
FIG. 3 shows a circuit diagram of an exemplary amplifier circuit according to a first embodiment of the invention.

FIG. 3 shows a circuit diagram of an exemplary amplifier circuit according to a first embodiment of the invention. The amplifier circuit 300 may at least comprise a detection circuit comprising a P-path detection circuit 310-1 and an N-path detection circuit 310-2, a different path gain control amplifier circuit 320 and an output stage circuit 330. The different path gain control amplifier circuit 320 may comprise an amplifier 321 with two cascaded-coupled amplifiers 322 and 323. The amplifier 321 may comprise a first input node coupled to a sensing node $V_{P,SENSE}$, a second input node coupled to a sensing node $V_{N,SENSE}$, a third input node coupled to a reference voltage $V_{REF}$ and a fourth input node coupled to the reference voltage $V_{REF}$. The amplifier 322 may comprise a first input node coupled to an output node $V_{XP}$ of the P-path detection circuit 310-1, a second input node coupled to a first output node $V_{OP1}$ of the amplifier 321, and an output node coupled to the control node V. The amplifier 323 may comprise a first input node coupled to an output node $V_{XN}$ the N-path detection circuit 310-2, a second input node coupled to a second output node $V_{ON1}$ of the amplifier 321, and an output node coupled to the control node $V_N$. The current source $I_{sig}$ represents the signal received from a previous stage amplifier circuit in the linear mode.

The P-path detection circuit 310-1 is coupled to the supply voltage $V_{DDD}$ and is arranged to detect disturbance occurred in the supply voltage $V_{DDD}$, so as to provide detection results, which may be a corresponding signal, voltage or current, to the first input node of the amplifier 322. The N-path detection circuit 310-2 is coupled to the supply voltage $V_{SSD}$ and is arranged to detect disturbances that occur in the supply voltage $V_{SSD}$, so as to provide detection results, which may be a corresponding signal, voltage, or current, to the first input node of the amplifier 323.

According to an embodiment of the invention, the different path gain control amplifier circuit 320 may compare the voltages at the sensing nodes $V_{P,SENSE}$ and $V_{N,SENSE}$ with the reference voltage $V_{REF}$, and generate the corresponding control signals at the control nodes $V_P$ and $V_N$ so as to correct the voltages at the control nodes $V_P$ and $V_N$. The voltages at the sensing nodes $V_{P,SENSE}$ and $V_{N,SENSE}$ may be designed to reflect the voltage changes in the source-gate/gate-source voltage $V_{SG}/V_{GS}$ of the output power transistors $M_P$ and $M_N$, respectively.

Figure 4:
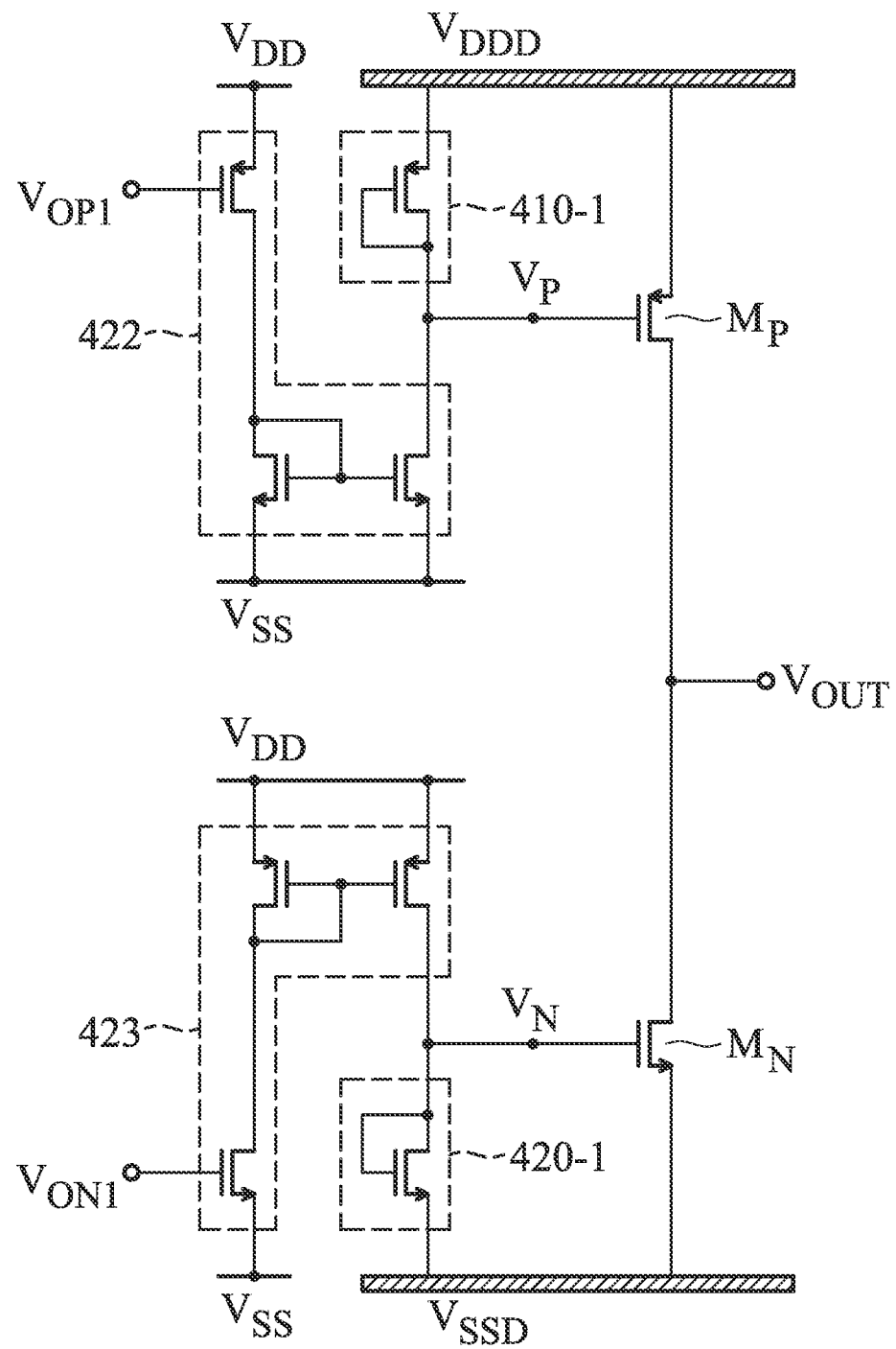
FIG. 4 shows an exemplary circuit diagram of the detection circuit and the two cascaded-coupled amplifiers in the different path gain control amplifier circuit according to the first embodiment of the invention.

FIG. 4 shows an exemplary circuit diagram of the detection circuit and the two cascaded-coupled amplifiers in the different path gain control amplifier circuit according to the first embodiment of the invention. According to an embodiment of the invention, the cascade-coupled amplifiers 422 and 423 may have similar structures. The P-path detection circuit 410-1 may comprise a diode-connected transistor coupled to the control node $V_P$, and the N-path detection circuit 420-1 may comprise a diode-connected transistor coupled to the control node $V_N$. Note that the circuit diagram of the amplifier 321 and the transistors $M_1$ and $M_2$ coupled to the different path gain control amplifier circuit 320 in FIG. 3 are omitted here for brevity. Note further that although the P-path detection circuit 410-1 and the N-path detection circuit 420-1 are directly coupled to the control nodes $V_P$ and $V_N$, the invention should not be limited thereto. Those who are skilled in this technology can readily appreciate that there may still be a variety of different implementations for the amplifiers 321, 322 and 323 and the detection circuits, and can make various alterations and modifications without departing from the scope and spirit of this invention. Therefore, the scope of the present invention shall be defined and protected by the following claims and their equivalents.

Referring back to FIG. 3, according to an embodiment of the invention, it is preferable to design the amplifiers 322 and 323 to have unit gain. For example, since the amplifier 322 has unit gain (e.g. $G_{ADDP}=1$), $\Delta V_P/\Delta V_{OP}=1$ and $\Delta V_P/\Delta V_{XP}=1$, where $\Delta V_P$ represents the amount of voltage change at the control node $V_P$, $\Delta V_{OP}$ represents the amount of voltage change at the output node $V_{OP1}$ and $\Delta V_{XP}$ represents the amount of voltage change in the output node $V_{XP}$. Similarly, since the amplifier 323 has unit gain (e.g. $G_{ADDN}=1$), $\Delta V_N/\Delta V_{ON}=1$ and $\Delta V_N/\Delta V_{XN}=1$, where $\Delta V_N$ represents the amount of voltage change at the control node $V_N$, $\Delta V_{ON}$ represents the amount of voltage change at the output node $V_{ON1}$ and $\Delta V_{XN}$ represents the amount of voltage change in the output node $V_{XN}$.

In addition, according to an embodiment of the invention, it is preferable to design the amplifier 321 to have a common mode rejection ratio CMRR far larger than 1 (that is, CMRR>>1), such that a common mode to differential mode gain $A_{CM2DM}$ of the amplifier 321 is far less than 1 or approaches 0. The common mode to differential mode gain $A_{CM2DM}$ may be defined by $A_{CM2DM}=|(V_P-V_N)/(V_{IN,CM})|$, where $V_P$ and $V_N$ here represents the voltages at the control nodes $V_P$ and $V_N$, and the $V_{IN,CM}$ represents the voltage of the input common mode signal. For example, when the $A_{CM2DM}$ approaches 0, it means that when the input signals at the four input nodes of the amplifier 321 are identical (that is, common mode signals), the common mode signals contribute nearly zero voltage to the differential signal output ($V_{OP}-V_{ON}$), where $V_{OP}$ represents the voltage at the output node $V_{OP1}$ and $V_{ON}$ represents the voltage at the output node $V_{ON}$.

According to an embodiment of the invention, when the P-path detection circuit 310-1 has detected that some disturbance has occurred in the supply voltage $V_{DDD}$, for example, the supply voltage $V_{DDD}$ is increased by $\Delta V_{DDD}$ due to the disturbance, the amount of change in the supply voltage $V_{DDD}$ can be reflected in the voltage at the output node $V_{XP}$ via the P-path detection circuit 310-1. For example, $\Delta V_{XP} \sim \Delta V_{DDD}$. Since the amplifier 322 coupled to the output node $V_{XP}$ has unit gain, the amount of voltage change $\Delta V_{XP}$ is output to the control node $V_P$, such that the voltage at the control node $V_P$ is also increased by $\Delta V_{DDD}$. Meanwhile, the voltage at the control node $V_N$ remains unchanged since it is not affected by the disturbance occurring in the supply voltage $V_{DDD}$. As both the supply voltage $V_{DDD}$ and the voltage at the control node $V_P$ have increased by $\Delta V_{DDD}$ and the voltage at the control node $V_N$ remains unchanged, the source-gate voltage $V_{SG}$ of the output power transistor $M_P$ remains unchanged, even though a disturbance occurred in the supply voltage $V_{DDD}$. In this manner, the output signal $V_{OUT}$ or current will not be affected by the disturbance occurred in the supply voltages and thus, the distortion will not occur. The operations of the N-path detection circuit 310-2 and the amplifier 323 are similar to those of the P-path detection circuit 310-1 and the amplifier 322, and the discussions are omitted here for brevity.

Figure 5:
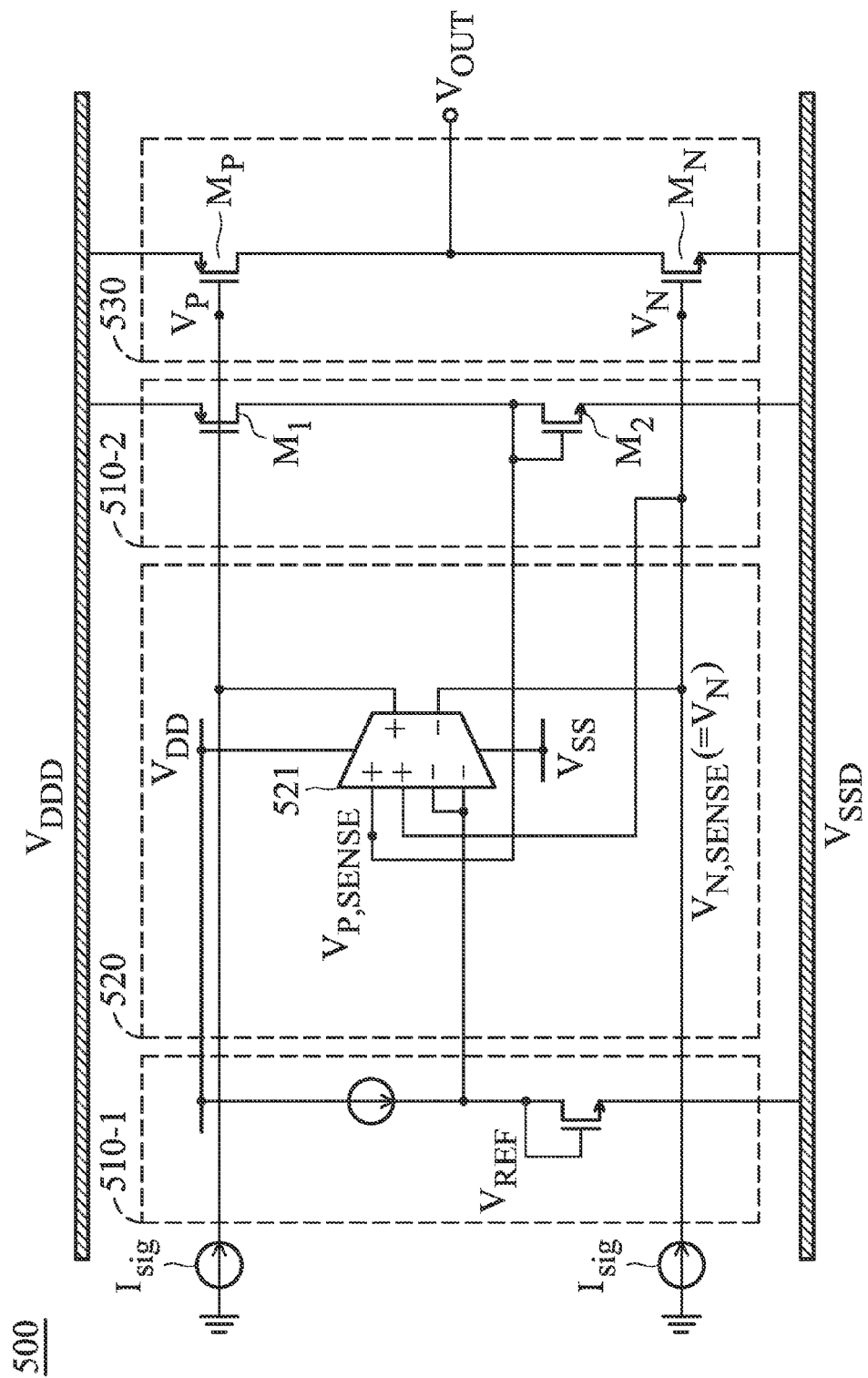
FIG. 5 shows a circuit diagram of an exemplary amplifier circuit according to a second embodiment of the invention.

FIG. 5 shows a circuit diagram of an exemplary amplifier circuit according to a second embodiment of the invention. The amplifier circuit 500 may at least comprise a detection circuit comprising a first circuit subunit 510-1 and a second circuit subunit 510-2, a different path gain control amplifier circuit 520 and an output stage circuit 530. In this embodiment, the current source and the transistor for providing the reference voltage $V_{REF}$ and the transistors $M_1$ and $M_2$ may be directly utilized for detecting the disturbances that occur in the supply voltages $V_{DDD}$ and $V_{SSD}$. The different path gain control amplifier circuit 420 may comprise an amplifier 521. The amplifier 521 may comprise a first input node coupled to a sensing node $V_{P,SENSE}$, a second input node coupled to a sensing node $V_{N,SENSE}$, a third input node coupled to the reference voltage $V_{REF}$ and a fourth input node coupled to the reference voltage $V_{REF}$. The current source $I_{sig}$ represents the signal received from a previous stage amplifier circuit in the linear mode.

According to an embodiment of the invention, unlike the amplifier 321 as illustrated in the first embodiment, it is preferable to design the amplifier 521 to have a finite common mode rejection ratio (CMRR), such that a common mode to differential mode gain $A_{CM2DM}$ of the amplifier 521 approaches 1 (or is 0 dB).

Figure 6:
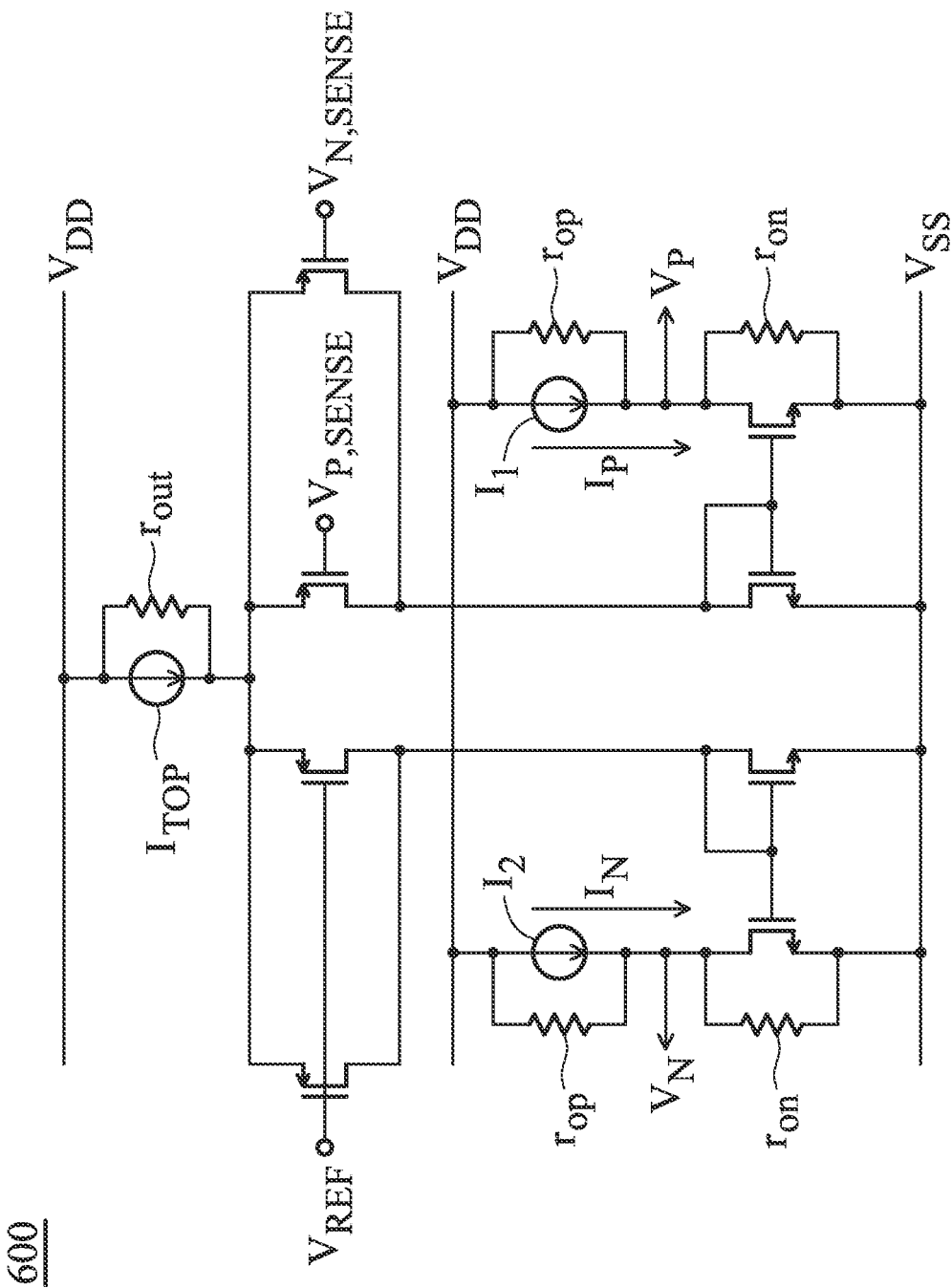
FIG. 6 shows an exemplary circuit diagram of the amplifier in the different path gain control amplifier circuit according to the second embodiment of the invention.

FIG. 6 shows an exemplary circuit diagram of the amplifier 521 in the different path gain control amplifier circuit 520 according to the second embodiment of the invention. According to an embodiment of the invention, the amplifier 600 may be implemented by a differential pair with a well-designed top current source $I_{TOP}$. In this embodiment, the goal of finite CMRR (or, $A_{CM2DM}$ approaches 1) may be achieved by designing $r_{out}=r_{op}//r_{on}$, where $r_{out}$ represents the output impedance of the top current source $I_{TOP}$, $r_{op}$ represents the output impedance of the current source $I_1$ coupled to the control node $V_P$ and the current source $I_2$ coupled to the control node $V_N$ and $r_{on}$ represents the output impedance of the NMOS transistor coupled to the control node $V_P$ and the NMOS transistor coupled to the control node $V_N$. Note that the amplifier 321 in the first embodiment of the invention may also be implemented as the amplifier 600 in the second embodiment, but note that the output impedance $r_{out}$ for implementing the amplifier 321 in the first embodiment is preferably designed to be very large (for example, over 10 M Ohm) such that the goal of CMRR>>1 or $A_{CM2DM}$ approaches 0 or far less than 1 can be achieved.

Figure 7:
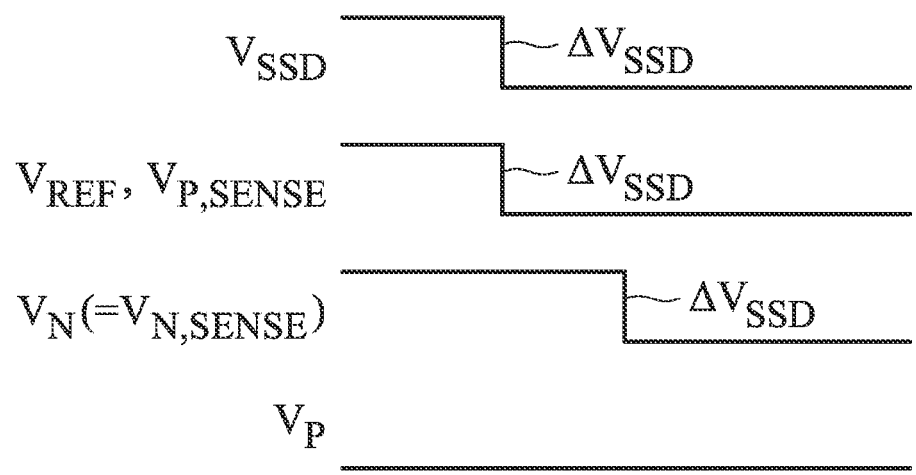
FIG. 7 is a schematic diagram showing the voltage change in different nodes according to the second embodiment of the invention.

FIG. 7 is a schematic diagram showing the voltage change in different nodes according to the second embodiment of the invention. Accompanying FIG. 6 with FIG. 7, operations of the different path gain control amplifier circuit will be further discussed in the following paragraphs. Suppose that the supply voltage $V_{SSD}$ is decreased by $\Delta V_{SSD}$ due to the disturbance, the amount of change in the supply voltage $V_{SSD}$ will be reflected on the voltage at the sensing node $V_{P,SENSE}$ and the reference voltage $V_{REF}$ via the detection circuit. After that, since the voltages provided to the input nodes of the amplifier 600 have been changed, the amplifier 600 may further control the voltage at the control node $V_N$ to decrease by about $\Delta V_{SSD}$. Note that in the embodiment of the invention, the amount of voltage change at the control node $V_N$ is preferably designed to be close to, but a little bit less than $\Delta V_{SSD}$, such that the current from the output impedance $r_{out}$ will not pass to the control node $V_P$. According to an embodiment of the invention, since $r_{out}=r_{op}//r_{on}$ and the current from the output impedance $r_{out}$ will not pass to the control node $V_P$, the amount of current change $\Delta I_{out}$ flowing through the output impedance $r_{out}$ equals the amount of current change $\Delta I_N$ flowing through the control node $V_N$ (because $\Delta I_{out}*r_{out}=\Delta I_N*(r_{op}//r_{on})$), where $\Delta I_{out} \sim \Delta V_{SSD}/r_{out}$, the current $I_N$ represents the current flowing through the control node $V_N$ and the current $I_P$ represents the current flowing through the control node V. In this manner, there would be no current change ($\Delta I_P \sim 0$) in the current $I_P$ flowing through the control node $V_P$, and thus the voltage at the control node $V_P$ remains unchanged as shown in FIG. 7. Note that those who are skilled in this technology can easily derive the operations of the detection circuit and the different path gain control amplifier circuit when a disturbance has occurred in the supply voltage $V_{DDD}$ based on the embodiments as discussed above, and the discussions are omitted here for brevity.

Figure 8:
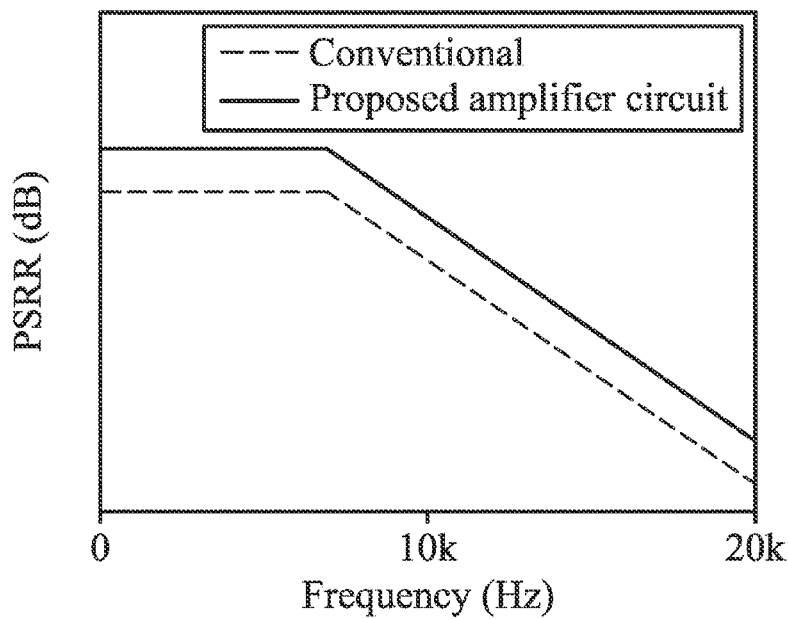
FIG. 8 shows simulation results of the output PSRR of the proposed amplifier circuit with respect to a conventional design.
Figure 9:
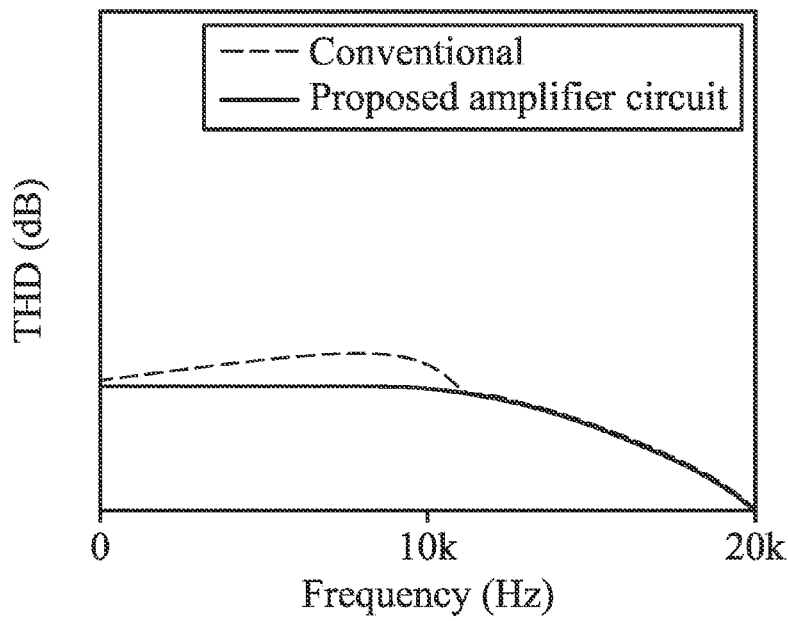
FIG. 9 shows simulation results of the THD of the proposed amplifier circuit with respect to a conventional design.

FIG. 8 shows simulation results of the output Power Supply Rejection Ratio (PSRR) of the proposed amplifier circuit with respect to a conventional design. As shown in FIG. 8, the output PSRR of the proposed amplifier circuit is greatly improved as compared with that of the conventional design. FIG. 9 shows simulation results of the Total Harmonic Distortion (THD) of the proposed amplifier circuit with respect to a conventional design. As shown in FIG. 9, the THD is also improved as compared with that of the conventional design.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An amplifier circuit receiving a first supply voltage and a second supply voltage, comprising:
   a detection circuit, detecting disturbances occurring in the first supply voltage and providing detection results to a control amplifier circuit;
   the control amplifier circuit, coupled to the detection circuit and controlling a first voltage provided to a first control node and a second voltage provided to a second control node in response to the detected results; and
   an output stage circuit, comprising:
   a first output power transistor, coupled to the control amplifier circuit at the first control node; and
   a second output power transistor, coupled to the control amplifier circuit at the second control node,
   wherein the first voltage and the second voltage are controlled differently when a disturbance is detected to have occurred.

2. The amplifier circuit as claimed in claim 1, wherein the control amplifier circuit controls the first voltage and the second voltage differently, such that the second voltage does not change when a disturbance is detected to have occurred in the first supply voltage.

3. The amplifier circuit as claimed in claim 2, wherein the detection circuit further detects disturbances occurring in the second supply voltage and provides the detection results, accordingly, and the control amplifier circuit controls the first voltage and the second voltage differently, such that the first voltage does not change when a disturbance is detected to have occurred in the second supply voltage.

4. The amplifier circuit as claimed in claim 1, wherein when the first voltage and the second voltage are adjusted in response to the detected disturbance, an amount of change in the first voltage is different from an amount of change in the second voltage.

5. The amplifier circuit as claimed in claim 1, wherein when a disturbance is detected to have occurred in the first supply voltage, an amount of change in the first voltage correlates with an amount of change in the first supply voltage and an amount of change in the second voltage is less than the amount of change in the first voltage.

6. The amplifier circuit as claimed in claim 5, wherein the detection circuit further detects disturbances occurring in the second supply voltage, and when a disturbance is detected to have occurred in the second supply voltage, an amount of change in the second voltage correlates with an amount of change in the second supply voltage and an amount of change in the first voltage is less than the amount of change in the second voltage.

7. The amplifier circuit as claimed in claim 1, wherein the control amplifier circuit controls the first voltage and the second voltage by controlling a first gain and a second gain of the control amplifier circuit in response to the detection results, wherein the first gain relates to the first voltage provided to the first control node, and the second gain relates to the second voltage provided to the second control node.

8. The amplifier circuit as claimed in claim 1, wherein the control amplifier circuit comprises:
a first amplifier, comprising a first input node coupled to a first sensing node, a second input node coupled to a second sensing node, a third input node coupled to a reference voltage, a fourth input node coupled to the reference voltage, a first output node coupled to the first control node, and a second output node coupled to the second control node.

9. The amplifier circuit as claimed in claim 8, wherein a common mode to differential mode gain of the first amplifier approaches 1.

10. The amplifier circuit as claimed in claim 8, wherein the control amplifier circuit further comprises:
a second amplifier, comprising a first input node coupled to the detection circuit, a second input node coupled to the first output node of the first amplifier, and an output node coupled to the first control node; and
a third amplifier, comprising a first input node coupled to the detection circuit, a second input node coupled to the second output node of the first amplifier, and an output node coupled to the second control node.

11. The amplifier circuit as claimed in claim 10, wherein the second amplifier and the third amplifier have unit gain, and a common mode to differential mode gain of the first amplifier approaches 0.

12. An amplifier circuit, comprising:
an output stage circuit, providing an output signal of the amplifier according to a first voltage and a second voltage;
a control amplifier circuit, providing the first voltage and the second voltage to the output stage circuit;
a detection circuit, detecting disturbances occurring in a first supply voltage and providing detection results to the control amplifier circuit;
wherein the control amplifier circuit only adjusts the first voltage in response to the detected disturbance occurring in the first supply voltage, and
wherein when a disturbance is detected to have occurred in the first supply voltage, the amount of change in the first voltage correlates with an amount of change in the first supply voltage.

13. The amplifier circuit as claimed in claim 12, wherein the detection circuit further detects disturbances occurring in a second supply voltage, and the control amplifier circuit only adjusts the second voltage in response to the detected disturbance occurring in the second supply voltage.

14. The amplifier circuit as claimed in claim 12, wherein the control amplifier circuit adjusts the first voltage by adjusting a first gain of the control amplifier circuit in response to the detection results, wherein the first gain relates to the first voltage provided to the output stage circuit.

15. The amplifier circuit as claimed in claim 12, wherein the control amplifier circuit comprises:
a first amplifier, comprising a first input node coupled to a first sensing node, a second input node coupled to a second sensing node, a third input node coupled to a reference voltage, a fourth input node coupled to the reference voltage, a first output node coupled to the output stage circuit, and a second output node coupled to the output stage circuit.

16. The amplifier circuit as claimed in claim 15, wherein a common mode to differential mode gain of the first amplifier approaches 1.

17. The amplifier circuit as claimed in claim 15, wherein the control amplifier circuit further comprises:
a second amplifier, comprising a first input node coupled to the detection circuit, a second input node coupled to the first output node of the first amplifier, and an output node coupled to the output stage circuit; and
a third amplifier, comprising a first input node coupled to the detection circuit, a second input node coupled to the second output node of the first amplifier, and an output node coupled to the output stage circuit.

18. The amplifier circuit as claimed in claim 17, wherein the second amplifier and the third amplifier have unit gain, and a common mode to differential mode gain of the first amplifier approaches 0.

* * * * *